United States Patent
Wong et al.

(10) Patent No.: US 8,384,103 B2
(45) Date of Patent: Feb. 26, 2013

(54) INCREASING CONTRAST IN ELECTRONIC COLOR DISPLAYS VIA SURFACE TEXTURING OF LEDS

(75) Inventors: Kum Soon Wong, Kuala Lumpur (MY); Lig Yi Yong, Simpang Ampat (MY); Kean Loo Keh, Gelugor (MY)

(73) Assignee: Intellectual Discovery Co., Ltd., Seoul (KR)

( * ) Notice: Subject to any disclaimer, the term of this patent is extended or adjusted under 35 U.S.C. 154(b) by 271 days.

(21) Appl. No.: 12/717,759

(22) Filed: Mar. 4, 2010

(65) Prior Publication Data

US 2011/0215347 A1    Sep. 8, 2011

(51) Int. Cl.
*H01L 33/00* (2010.01)
*H01L 23/28* (2006.01)
*H01L 21/00* (2006.01)

(52) U.S. Cl. ... 257/98; 257/100; 257/787; 257/E33.059; 438/71

(58) Field of Classification Search ............ 257/89, 257/98, E33.059, E33.06, E33.067; 438/27, 438/28, 71
See application file for complete search history.

(56) References Cited

U.S. PATENT DOCUMENTS

| | | |
|---|---|---|
| 2005/0007000 A1 | 1/2005 | Chou et al. |
| 2006/0290253 A1 | 12/2006 | Yeo et al. |
| 2007/0047254 A1* | 3/2007 | Schardt et al. ............. 362/607 |
| 2007/0052663 A1 | 3/2007 | Kim et al. |
| 2008/0121918 A1* | 5/2008 | DenBaars et al. ........... 257/98 |
| 2008/0308825 A1* | 12/2008 | Chakraborty et al. ........ 257/98 |

FOREIGN PATENT DOCUMENTS

| | | |
|---|---|---|
| CN | 201285633 Y | 8/2009 |
| WO | 2008/155368 A1 | 12/2008 |

* cited by examiner

*Primary Examiner* — Matthew Landau
*Assistant Examiner* — Khaja Ahmad
(74) *Attorney, Agent, or Firm* — Fox Rothschild, LLP (57) ABSTRACT

In an embodiment, the invention provides a light source comprising a plurality of light-emitting semiconductor chips, a plurality of electrical leads and an encapsulant. The plurality of electrical leads is connected to the plurality of light-emitting semiconductor chips. The encapsulant completely encases the plurality of semiconductor chips. The encapsulant partially encases the plurality of electrical leads.

9 Claims, 13 Drawing Sheets

FIG. 12B

INCREASING CONTRAST IN ELECTRONIC COLOR DISPLAYS VIA SURFACE TEXTURING OF LEDS

BACKGROUND

In the area of digital imaging, a pixel (or picture element) is usually the smallest item of information in an image. Pixels are normally arranged in a two-dimensional gird and are often represented using dots or squares. Each pixel is a sample of an original image, where more samples typically provide more accurate representations of the original image. The intensity of each pixel is usually variable. In electronic color displays, such as flat-panel televisions, each pixel has typically three or four components. A three component pixel may have, for example, red, green and blue components. A four component pixel may have, for example, cyan, magenta, yellow and black components.

Color components are usually LEDs (Light Emitting Diodes). LEDs are usually based semiconductor diode chips. When a semiconductor diode chip is forward biased, electrons recombine with holes and energy is released in the form of light. This effect is called electroluminescence. The color of the light is determined by the energy gap of the semiconductor diode chip. The semiconductor diode chip is usually small in area, often less than 1 mm². A package that contains a semiconductor diode chip is usually larger than the semiconductor diode chip. For example, the diameter of a discrete packaged LED may be 4 or 5 mm.

A FCD (full color display) board typically uses discrete color LEDs to form a pixel. A FCD board is usually a very large video screen such as those used in baseball stadiums, arena events, music events and large format advertising on the side of buildings. Because FCD boards are often used outdoors, sunlight reflected into an LED can reduce the contrast (the difference in brightness between one pixel and another pixel) of the display. For example, sunlight reflected into an "off" pixel can cause the "off" pixel to appear brighter than it would have with no sunlight reflected into the off pixel.

DETAILED DESCRIPTION

The drawings and description, in general, disclose a light-emitting semiconductor chip, electrical leads for electrically coupling power to the light-emitting semiconductor chip and an encapsulant. The encapsulant completely encases the light-emitting semiconductor chip and partially encases the electrical leads. A portion of the outer surface of the encapsulant is textured in order to diffuse light from light sources other than the light-emitting semiconductor chip. Diffusing light from light sources other than the light-emitting semiconductor chip reduces the amount of light that is reflected into the area where light from the semiconductor chip is directed. As a result, a video display containing many light-emitting semiconductor chips will have better contrast. The surface of the area where light from the semiconductor chip is directed is substantially untextured to allow more direct light to leave the encapsulant.

Figure 1:
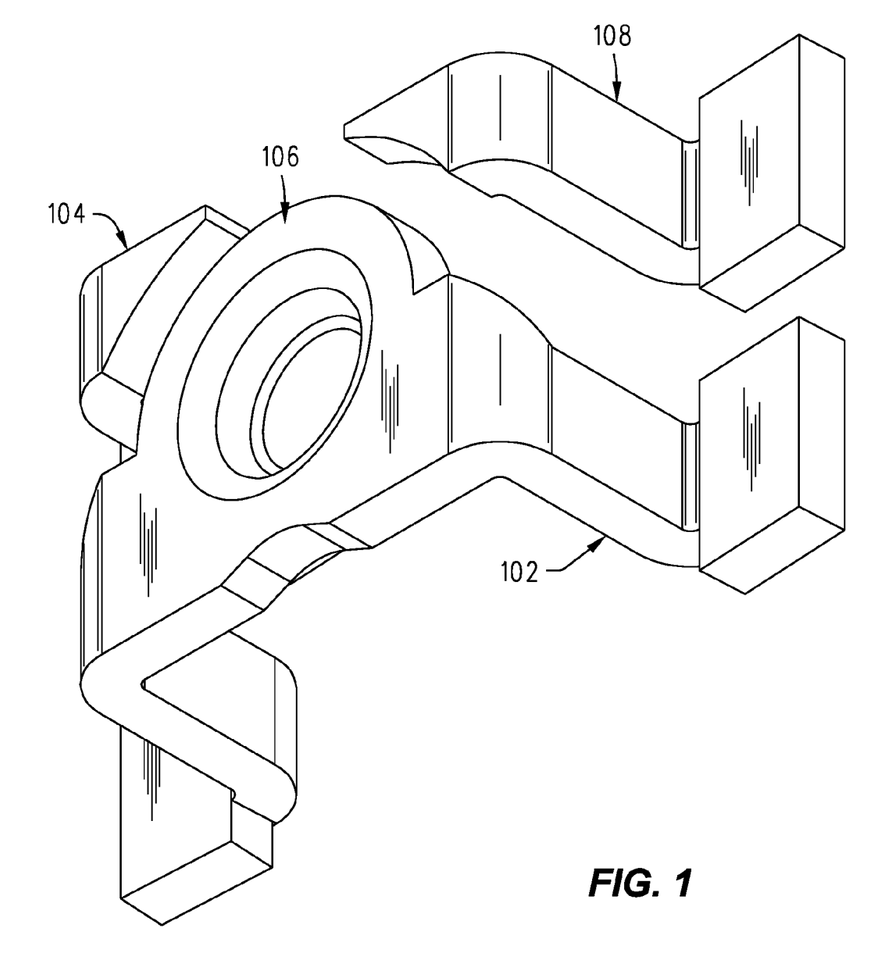
FIG. 1 is an isometric view of an embodiment of electrical leads.

FIG. 1 is an isometric view of an embodiment of electrical leads. In this embodiment, electrical lead 102 contains a "cup" 106 where a light-emitting semiconductor (not shown), for example an LED, may be physically and electrically connected. Electrical leads 104 and 108 together with wire bonds (not shown in FIG. 1) may be used to make electrical connections to the light-emitting semiconductor. In this embodiment, gull wing leads are used. However, other electrical leads such as J leads, SOJ leads, reverse gull wing leads and straight cut leads may be used in embodiments of this invention.

Figure 2:
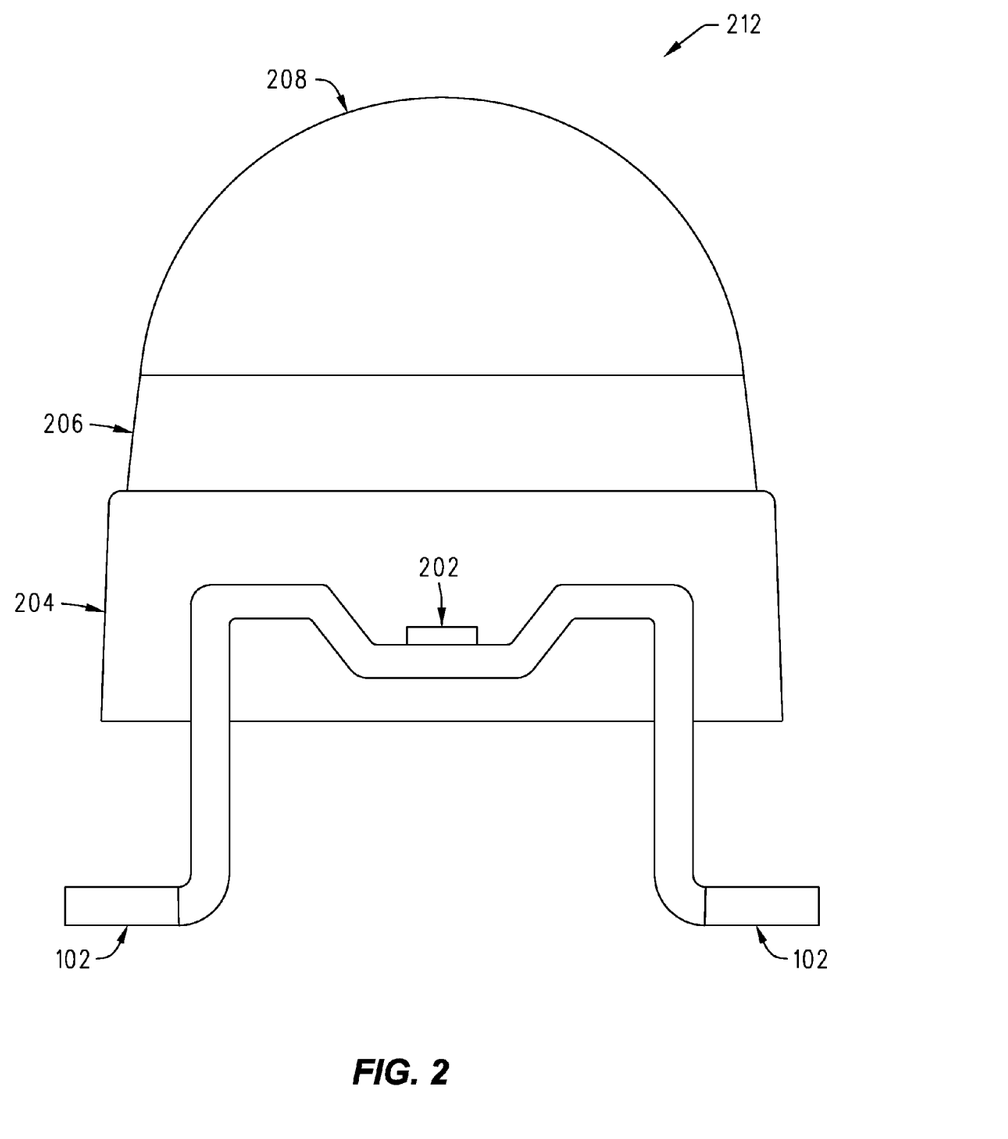
FIG. 2 is a sectional view of an LED in accordance with an exemplary embodiment of the invention.

FIG. 2 is a sectional view of an LED 200 in accordance with an exemplary embodiment of the invention. In this embodiment, a first electrical lead 102 is electrically and physically connected to a light-emitting semiconductor chip 202. In this embodiment, the light-emitting semiconductor chip 202 is an LED chip. However, in other embodiments, the light-emitting semiconductor chip 202 may be a semiconductor laser or other semiconductors that emit electromagnetic radiation. The electromagnetic radiation emitted from the light-emitting semiconductor chip 202 includes visible light, ultra-violet light and infra-red light.

In this embodiment, the encapsulant 212 completely encases the LED 202 and partially encases electrical leads 102, 104 (not shown) and 108 (not shown). The encapsulant 212 includes sections 204, 206 and 208. Each of these sections may be made of the same or different materials. These materials include, but are not limited to, epoxy, silicone and glass.

Figure 3:
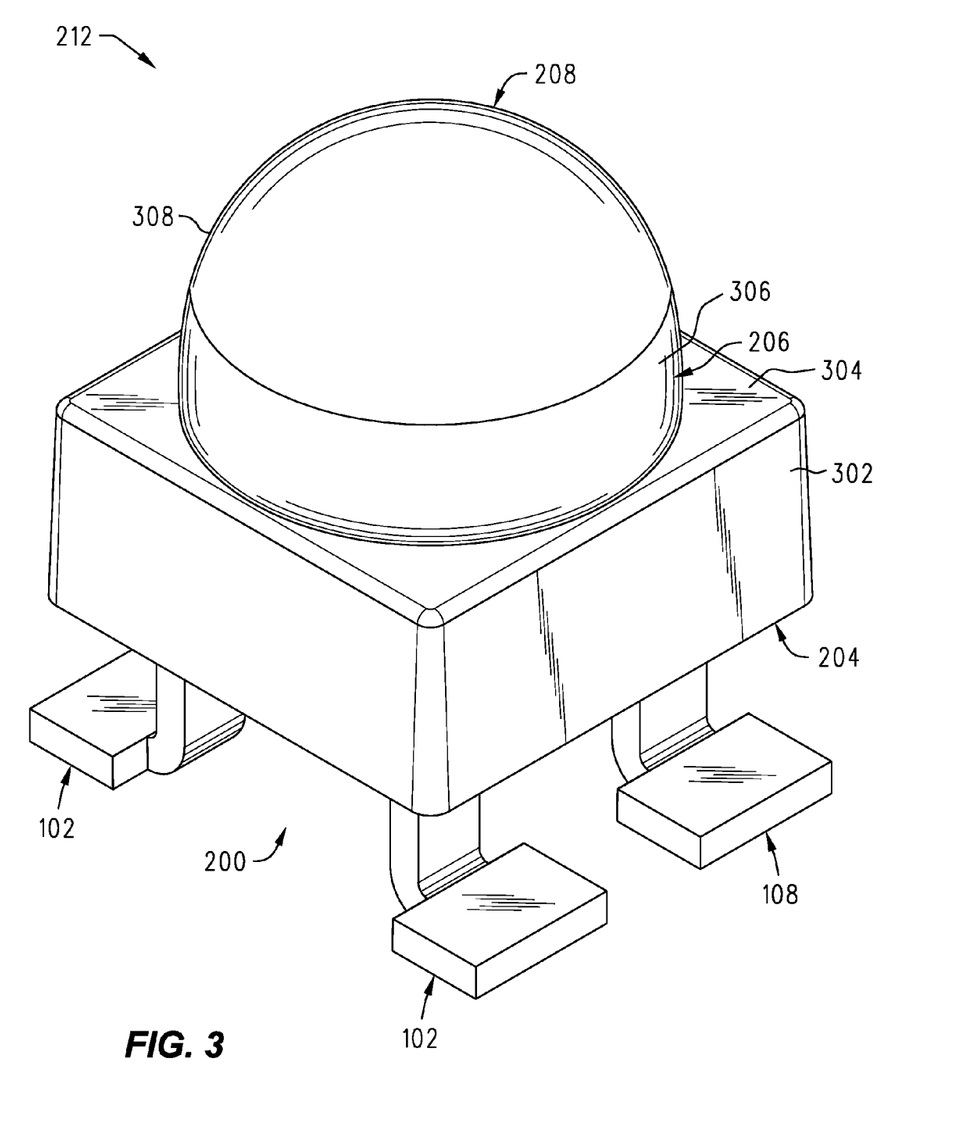
FIG. 3 is an isometric view of an LED in accordance with an exemplary embodiment of the invention.

FIG. 3 is an isometric view of an LED 200 in accordance with an exemplary embodiment of the invention. In this embodiment, each section 204, 206 and 208 of the encapsulant 212 has an outer surface. Outer surfaces 302 and 304 are part of section 204. Outer surface 306 is part of section 206 and outer surface 308 is part of section 208. In this embodiment, outer surfaces 302, 304 and 306 are textured in order to diffuse light from light sources other than the LED chip 202. This will be explained in more detail later.

Figure 4:
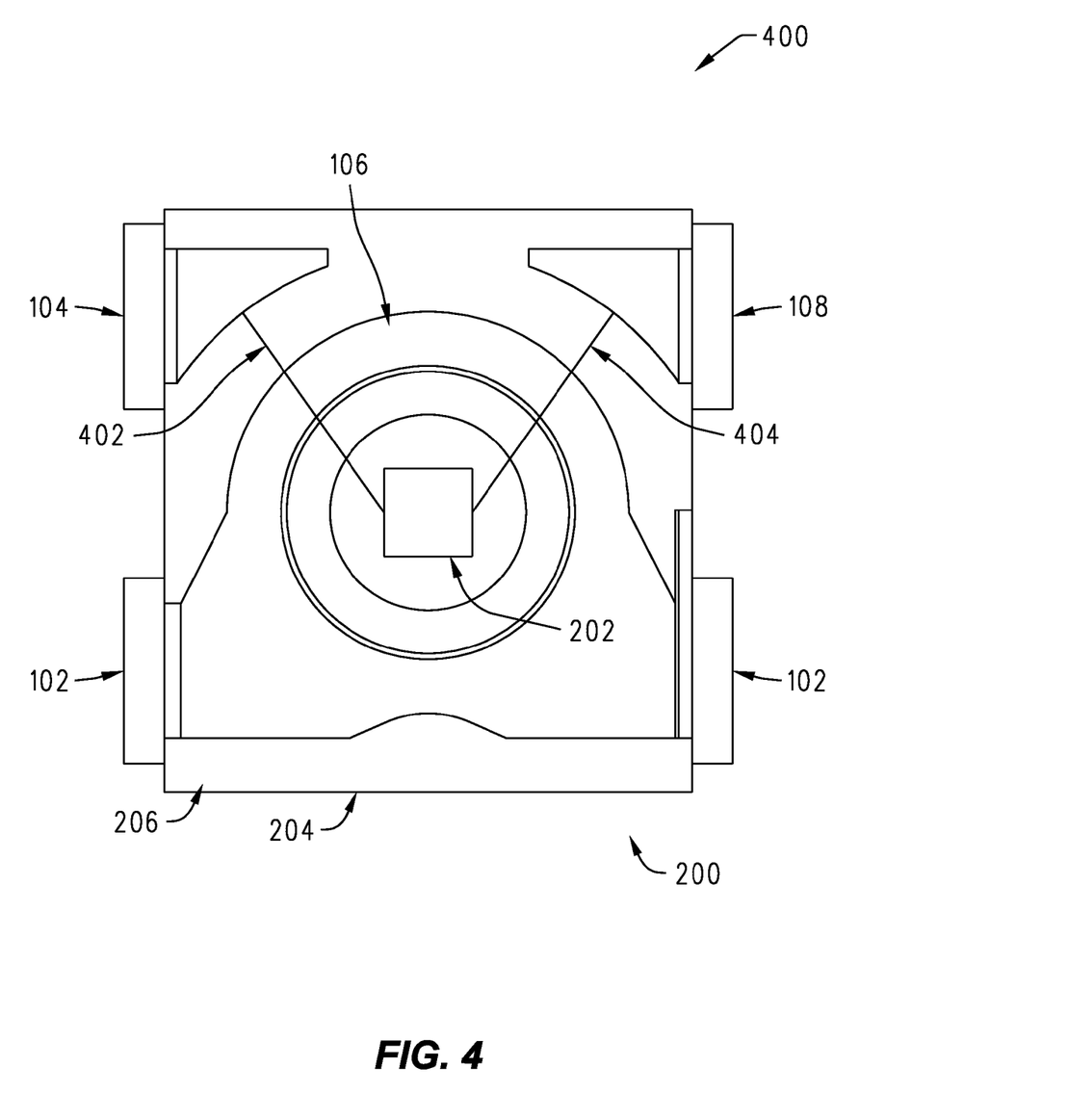
FIG. 4 is a top sectional view of an LED in accordance with an exemplary embodiment of the invention.

FIG. 4 is a top sectional view of an LED 200 in accordance with an exemplary embodiment of the invention. In this embodiment, wire bond 402 is electrically connected to electrical lead 104 and the LED chip 202. The wire bond 404 is electrically connected to electrical lead 108 and the LED chip 202. In this example, both electrical leads 104 and 108 are electrically connected to power supply voltage VDD. However, either 104 or 108 alone may be connected to power supply voltage VDD. GND of the power supply is connected to electrical lead 102 in this example.

Figure 6:
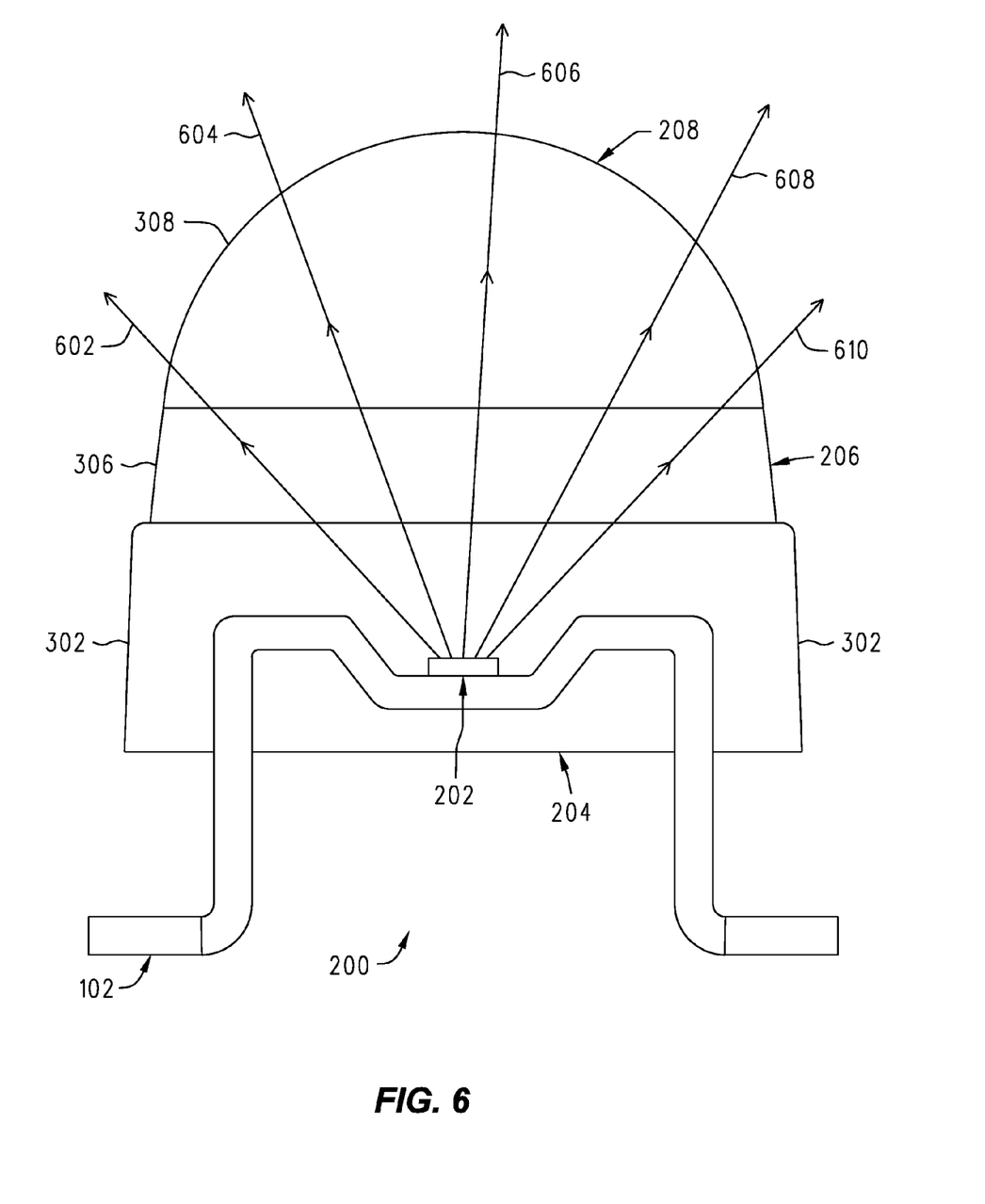
FIG. 6 is a sectional view of an LED in accordance with an exemplary embodiment of the invention illustrating a path of electromagnetic radiation emitted from a semi-conductor chip.

FIG. 6 is a sectional view of an LED 200 in accordance with an exemplary embodiment of the invention illustrating a path of electromagnetic radiation emitted from a light-emitting semiconductor chip. In this example, the light-emitting semiconductor chip is an LED chip 202. The electromagnetic radiation 602, 604, 606, 608, and 610 emitted from the LED chip 202 leaves surface 308. In this example, the surface 308 is substantially untextured to allow as much light as possible to leave surface 308. If the surface was textured, some of the light from LED chip 202 would be diffused. As a result, the LED 200 would not be as bright as it would have been without a textured surface 308.

Figure 5:
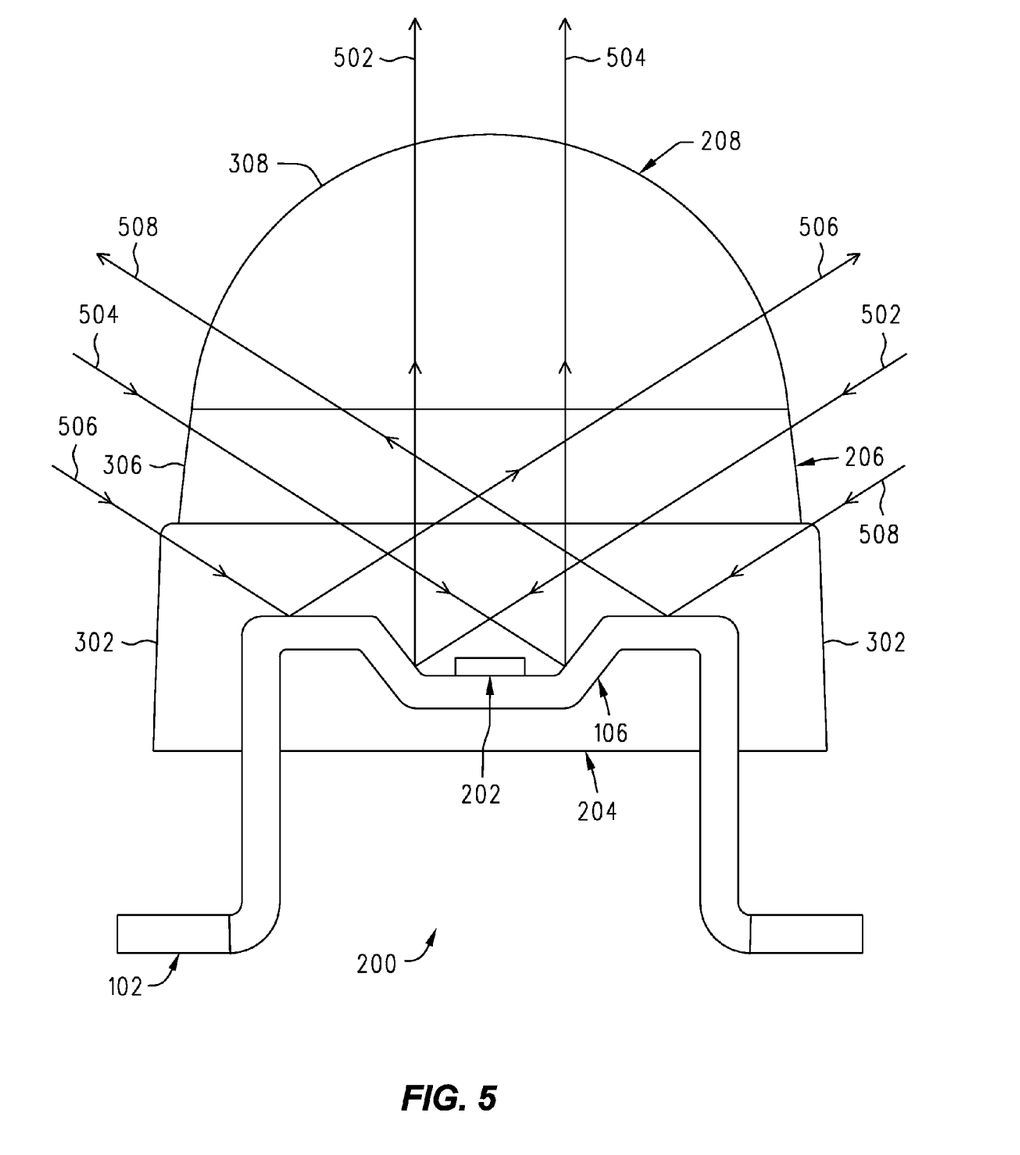
FIG. 5 is a sectional view of an LED in accordance with an exemplary embodiment of the invention illustrating reflection of external light without texturing of a portion of the encapsulant.

FIG. 5 is a sectional view of an LED 200 in accordance with an exemplary embodiment of the invention illustrating the reflection of external light without texturing of the encapsulant. In this example, external light 504 from a source other than LED chip 202 is reflected from an inner wall of the cup 106 of the electrical lead 102 back through section 208. Because the external light 504 was not emitted from the LED chip 202, the light leaving surface 308 is brighter than it would have been without the external light 504. Because the light leaving surface 308 is brighter than it would have been without the external light 504, contrast is reduced between this LED 200 and any other LEDs that may be a part of an electronic color display.

In this example, external light 506 from a source other than LED chip 202 is reflected from a surface of the electrical lead 102 back through section 208. In addition, external light 502 from a source other than LED chip 202 is reflected from an inner wall of the cup 106 of the electrical lead 102 back through section 208. Furthermore, external light 508 from a source other than LED chip 202 is reflected from a surface of the electrical lead 102 back through section 208. The combination of external light 502, 504, 506 and 508 reflected back through section 208 causes the light leaving surface 308 to be brighter than it would have been without the external light 504. Because the light leaving surface 308 is brighter than it would have been without the external lights 502, 504, 506, and 508, contrast is reduced between this LED 200 and any other LEDs that may be a part of an electronic color display.

Sources of external light include sunlight and artificial light (e.g. light from sources other than the sun). Sources of artificial light include incandescent light, halogen light, fluorescent light, gas discharge light and electrical arc light.

Figure 7:
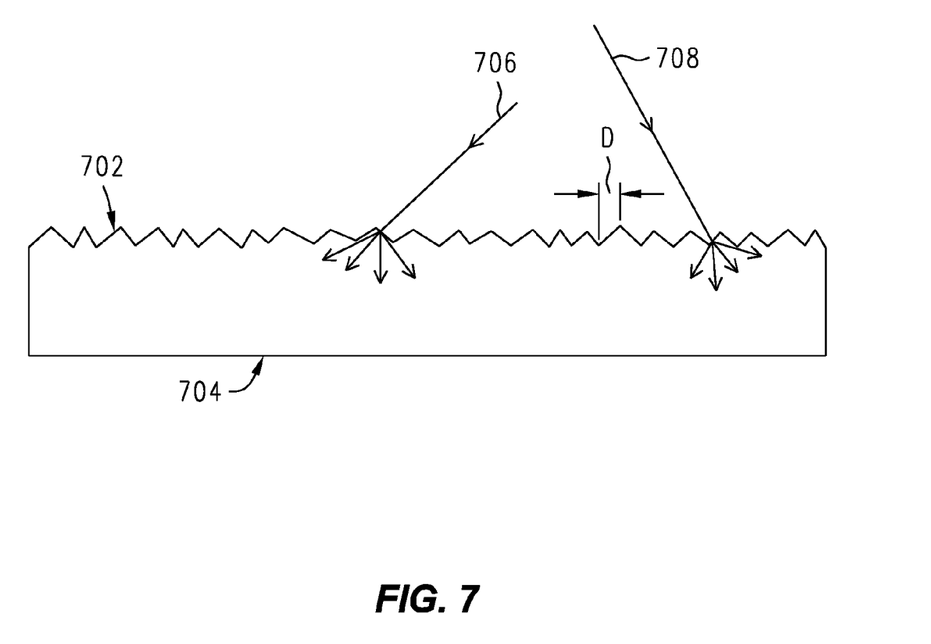
FIG. 7 is a side view of a surface with hill-and-valley texturing in accordance with an exemplary embodiment of the invention illustrating diffusion of external light.

FIG. 7 is a side view of a surface 704 with "hill-and-valley" texturing in accordance with an exemplary embodiment of the invention illustrating diffusion of external light. In this example, a surface 704 is textured 702 using one of several methods. The type of texture shown in FIG. 7 is often called hill-and-valley texturing. Typically, the distance D from a hill top and to the bottom of a valley is about 1 to 2 microns. However, other distances may be used. One method for texturing a surface uses electro-discharge machining. Another method for texturing a surface uses chemical etching, however other methods may be used.

In FIG. 7 directional light 706 and 708 striking the textured surface 702 is diffused. Diffused light reduces the intensity of directional light by scattering it in many directions as shown in FIG. 7.

Figure 8:
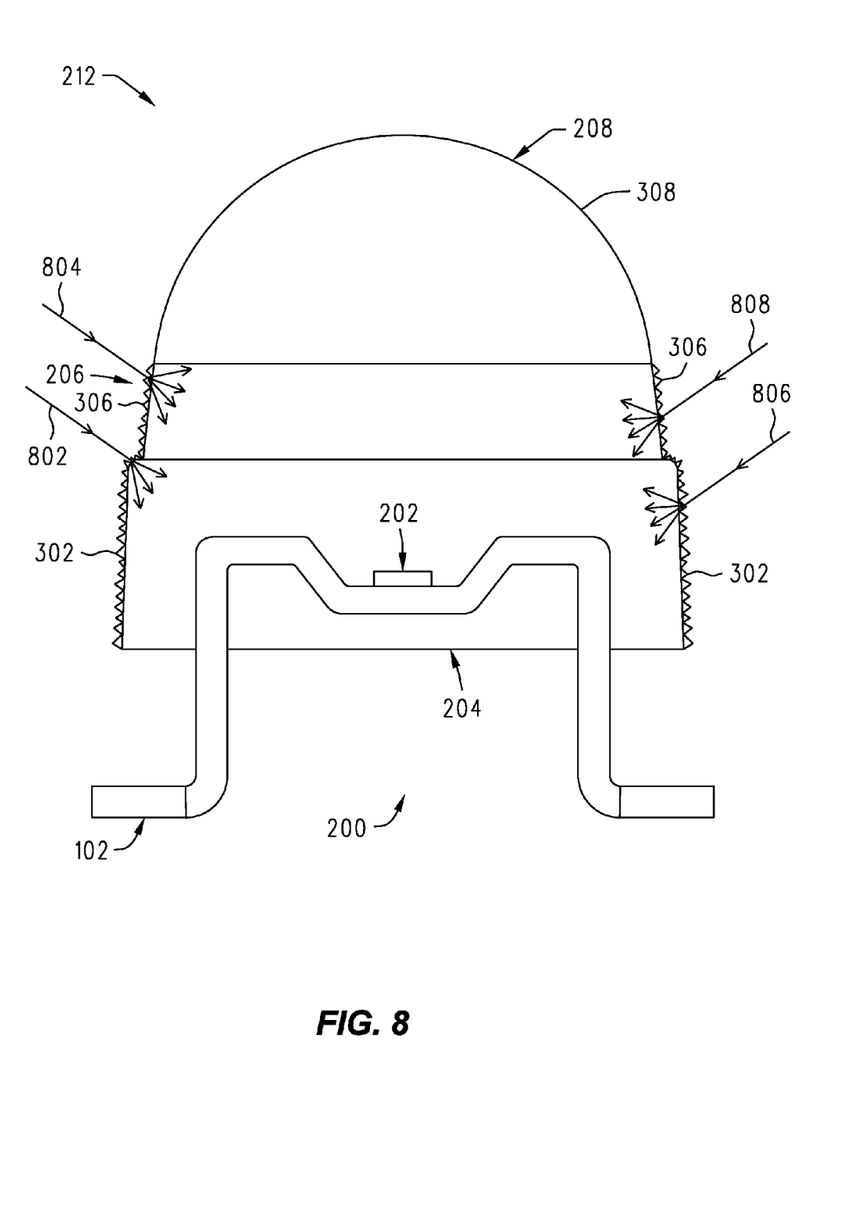
FIG. 8 is a sectional view of an LED in accordance with an exemplary embodiment of the invention illustrating diffusion of external light with texturing of portions of the outer surface of the encapsulant.

FIG. 8 is a sectional view of an LED 200 in accordance with an exemplary embodiment of the invention illustrating diffusion of external light with texturing of portions of the outer surface of the encapsulant 212. In this embodiment, surfaces 302, 304 and 306 are textured. Surface 308 is not textured to allow light from the LED chip 202 to pass through surface 308 with little diffusion. Surface texturing induces surface diffusivity, not volumetric diffusivity.

In the embodiment shown in FIG. 8, external light 804 and 808 impinging on surface 306 is scattered reducing the amount of external light reflected through surface 308. External light 802 impinging on surface 304 is scattered reducing the amount of external light reflected through surface 308. External light 806 impinging on surface 302 is scattered reducing the amount of external light reflected through surface 308. Because the amount of external light reflected through surface 308 is reduced, contrast between LED 200 and any other LEDs in an electronic color display is increased. In this embodiment, three surfaces 302, 304 and 306 were textured. However fewer surfaces could be textured with improvement in the contrast of an electronic color display.

Figure 9:
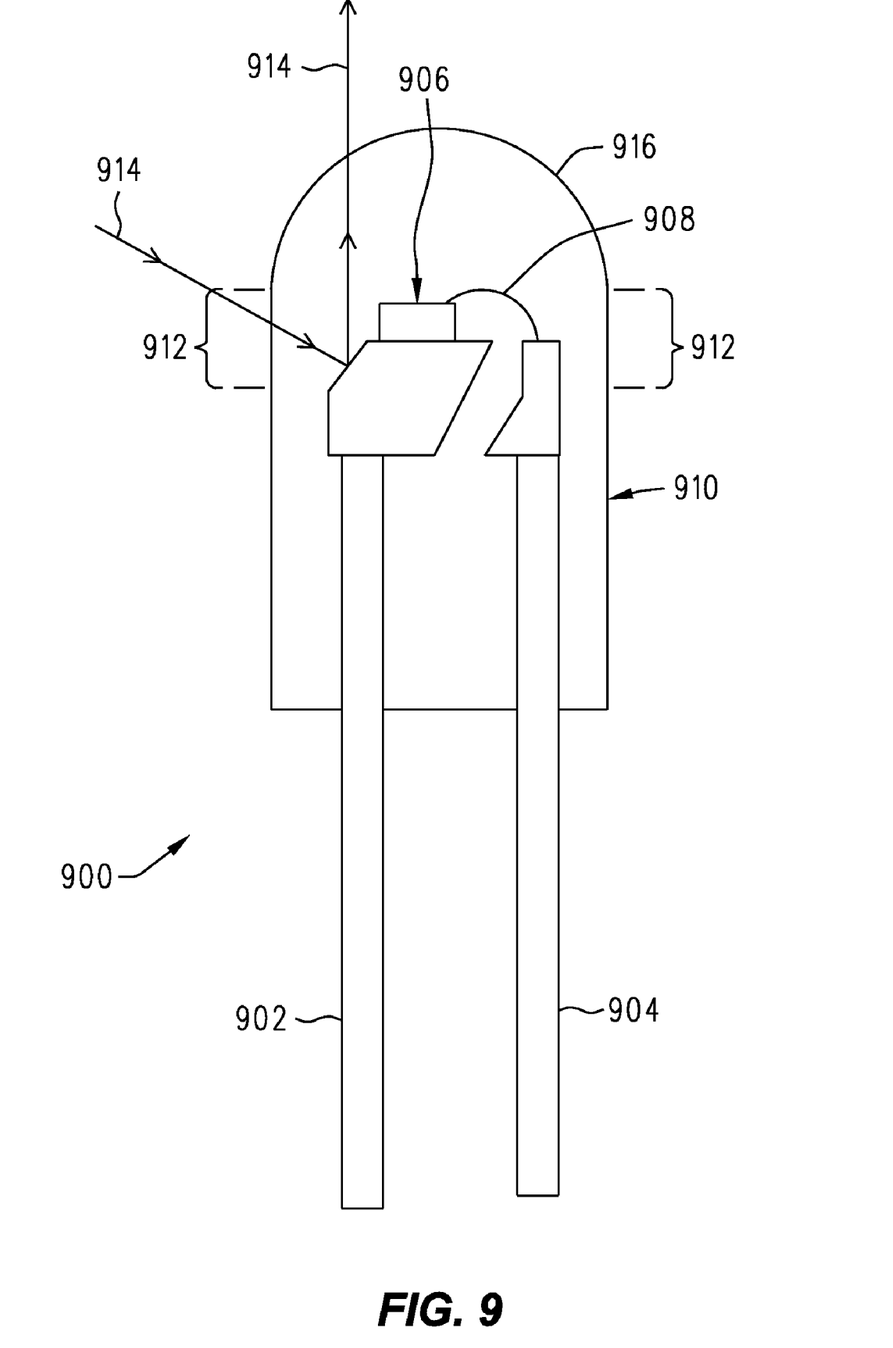
FIG. 9 is a sectional view of an LED in accordance with an embodiment of the invention.

FIG. 9 is a sectional view of an LED 900 in accordance with an embodiment of the invention. In this example, an LED chip 906 is physically and electrically attached to an electrical lead 902. A wire bond 908 is electrically attached to electrical lead 904 and LED chip 906. In this embodiment an LED chip 906 is used, however other light-emitting semiconductor chips may be used as well. An encapsulant 910 completely covers the LED 906 and the wire bond 908 and partially covers the electrical leads 902 and 904. In this embodiment, straight cut leads are used. However, other electrical leads such as J leads, SOJ leads, reverse gull wing leads and gull wing leads may be used in the embodiments of this invention. The encapsulant 910 in this example is made of epoxy but other materials may be used such as silicone or glass.

In the example shown in FIG. 9, the portion 912 of surface 916 is not substantially textured. As a result, most of external light 914 passes through portion 912 of surface 916 and is reflected off electrical lead 902 back through the top of LED 900. Because the light 914 reflected through the top of LED 900 is external light, not light emitted from LED chip 906, light leaving the top of the LED 900 is brighter than it would have been without the external light 914. Because the light leaving the top of LED 900 is brighter than it would have been without the external light 914, contrast is reduced between this LED 900 and any other LEDs that may be a part of an electronic color display.

Figure 10:
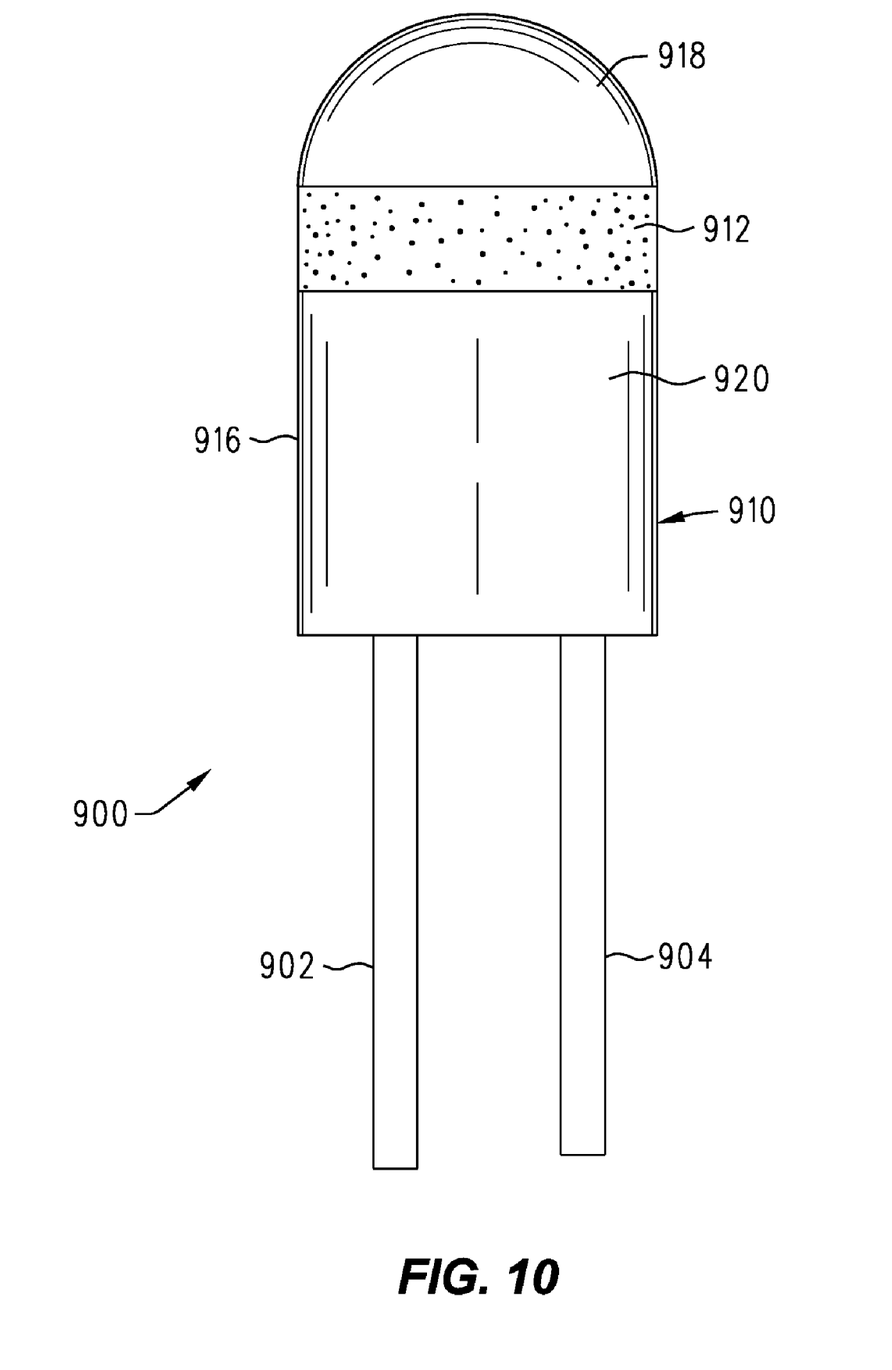
FIG. 10 is an isometric view of an LED with texturing on a portion of the surface of the encapsulant in accordance with an embodiment of the invention.

FIG. 10 is an isometric view of an LED 900 with texturing on a portion 912 of the surface 916 of the encapsulant 910 in accordance with an embodiment of the invention. In this example, a portion 912 of the surface 916 of the LED 900 is textured. Portions 918 and 920 of the surface 916 are not textured. One method for texturing a surface uses electro-discharge machining. Another method for texturing a surface uses chemical etching; however other methods may be used.

Figure 11:
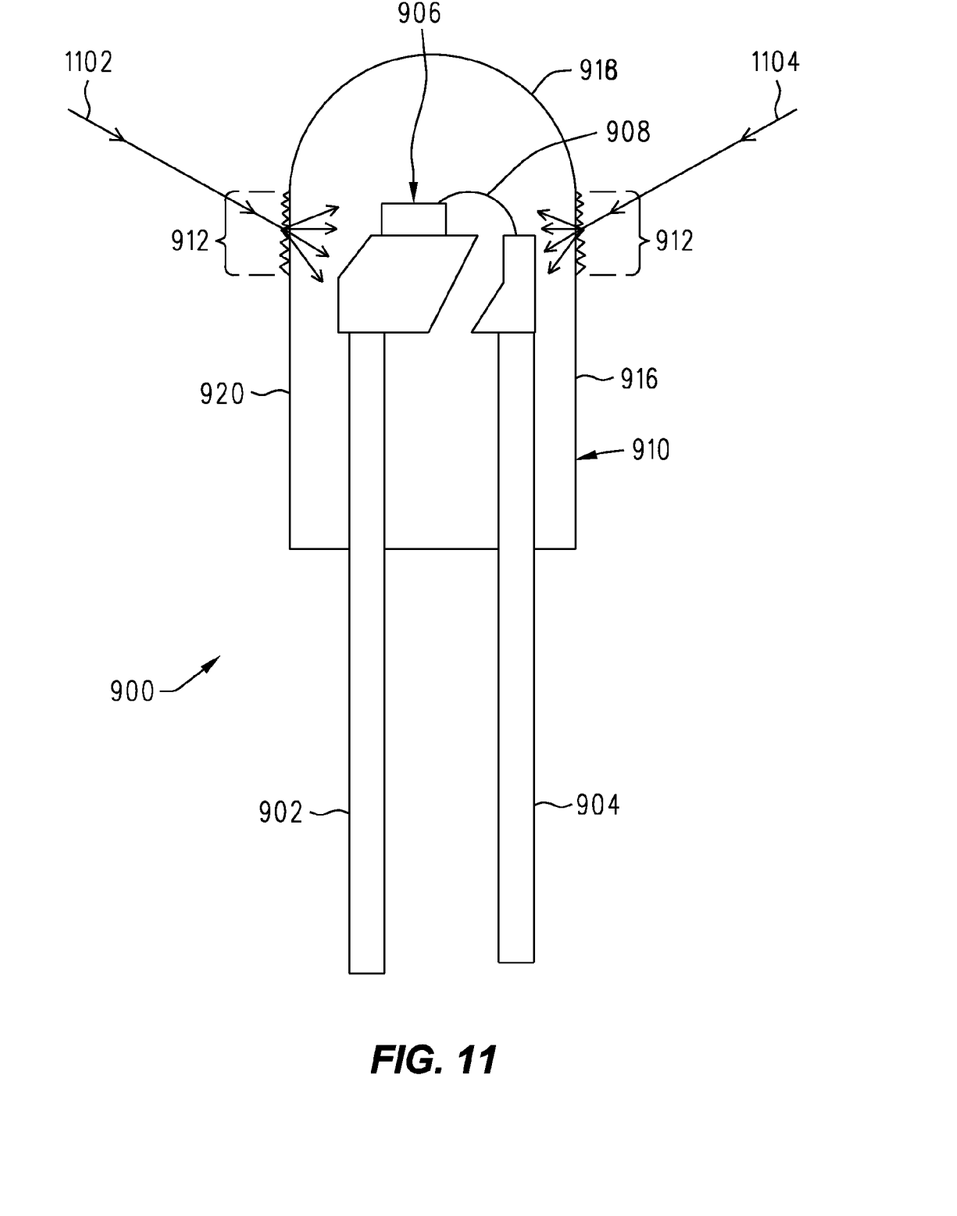
FIG. 11 is a sectional view of an LED with texturing on a portion of the surface of the encapsulant in accordance with an embodiment of the invention.

FIG. 11 is a sectional view of an LED 900 with texturing on a portion 912 of the surface 916 of the encapsulant 910 in accordance with an embodiment of the invention. In this embodiment, portion 912 of surface 916 is textured. Portions 918 and 920 of the surface 916 are not textured. Portion 918 is not textured to allow light from the LED chip 906 to pass through portion 918 with little diffusion. Surface texturing induces surface diffusivity, not volumetric diffusivity.

In the embodiment shown in FIG. 11, external light 1102 and 1104 impinging on portion 912 is scattered reducing the amount of external light reflected through portion 918. Because the amount of external light 1102 and 1104 reflected through portion 918 is reduced, contrast between LED 900 and any other LEDs in an electronic display is increased. In this embodiment, only portion 912 was textured. However, more surfaces could be textured with improvement in the contrast of an electronic display.

Figure 12A:
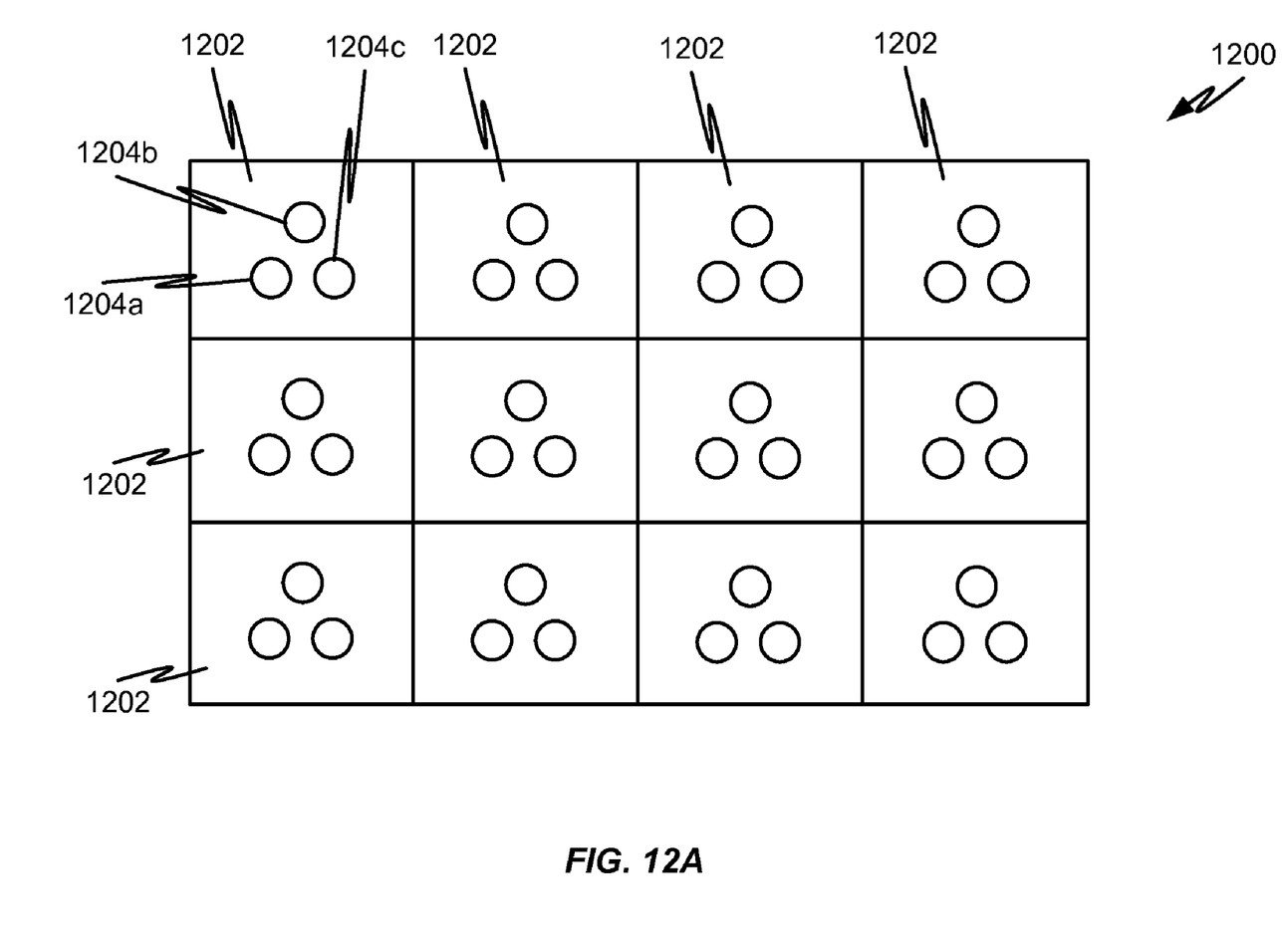
FIG. 12A is a top view of an electronic display in accordance with an embodiment of the present disclosure.
Figure 12B:
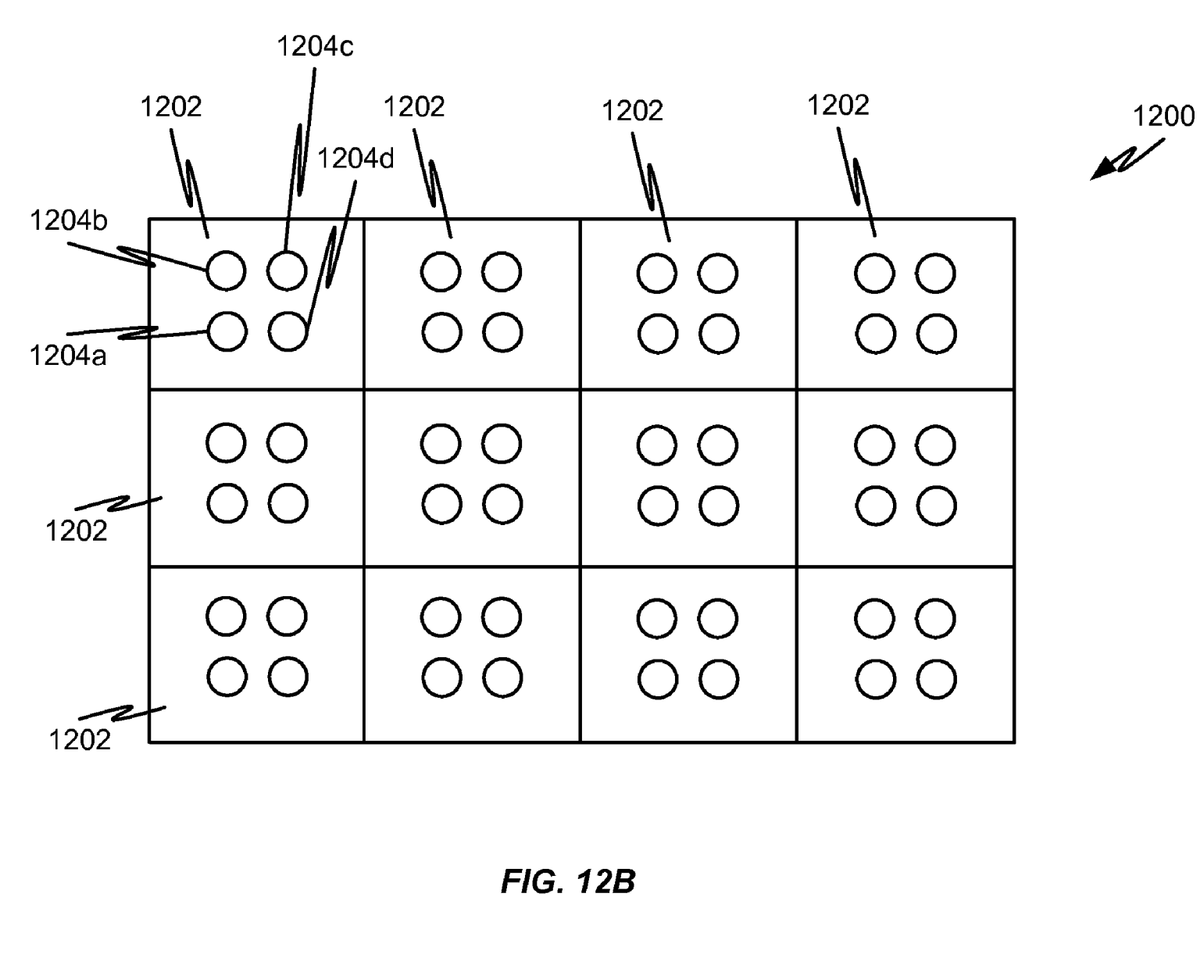
FIG. 12B is a top view of an electronic display in accordance with an embodiment of the present disclosure.

FIGS. 12A and 12B depict two possible configurations of an electronic display 1200 in accordance with embodiments of the present disclosure. Specifically, an electronic display 1200 may be a color display and comprise a plurality of pixels 1202, each of which may be provided with a plurality of LEDs. In some embodiments, a pixel 1202 may comprise three discrete LEDs 1204a, 1204b, 1204c. In some embodiments, a pixel 1202 may comprise four discrete LEDs 1204a, 1204b, 1204c, 1204d.

The foregoing description has been presented for purposes of illustration and description. It is not intended to be exhaustive or to limit the invention to the precise form disclosed, and other modifications and variations may be possible in light of the above teachings. The exemplary embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. An electronic color display, the electronic color display comprising a plurality of LEDs wherein at least one LED in the plurality of LEDs comprises:
    a plurality of electrical leads;
    a light-emitting semiconductor chip wherein at least two of the plurality of electrical leads are electrically coupled to the semiconductor chip and wherein the light-emitting semiconductor chip is mounted on a first surface of at least one of the plurality of electrical leads and the light-emitting semiconductor chip is configured to emit light away from the first surface;
    an encapsulant having an outer surface wherein the encapsulant completely encapsulates the semiconductor chip and partially encapsulates the plurality of electrical leads;
    wherein at least a first portion of the outer surface is textured as a band around the light-emitting semiconductor chip, wherein the band of the at least a first portion of the outer surface at least partially extends below the first surface, and wherein at least a second portion of the outer surface above the at least a first portion of the outer surface is substantially untextured and at least a third portion of the outer surface below the at least a first portion of the outer surface is substantially untextured;
    wherein electromagnetic radiation, from a source other than the semiconductor chip, impinging on the at least a first portion is diffused;
    wherein at least a portion of electromagnetic radiation emitted from the semiconductor chip passing through the at least second portion of the outer surface is substantially undiffused by the at least second portion of the outer surface.

2. The electronic display of claim 1 wherein the electronic display is selected from a group of electronic displays consisting of flat-panel televisions, flat-panel display screens, display screens on laptop computers, display screens on cellular telephones, and display screens on personal digital assistants.

3. The electronic color display of claim 1 comprising a plurality of pixels wherein each pixel in the plurality of pixels comprises: a group of three discrete LEDs from the plurality of LEDs wherein the three discrete LEDS are physically in close proximity to each other.

4. The electronic color display of claim 3 wherein a first discrete LED in the group of three discrete LEDs comprises a red LED, the red LED emitting red light;
    wherein a second discrete LED in the group of three discrete LEDs comprises a blue LED, the blue LED emitting blue light;
    wherein a third discrete LED in the group of three discrete LEDs comprises a green LED, the green LED emitting green light.

5. The electronic color display of claim 4 wherein the electronic color display is a full color display board.

6. The electronic color display of claim 5 wherein the full color display board is selected from a group of full color displays consisting of video screens used in sporting events, video screens used in music events, and video screens used for large format advertising on sides of buildings.

7. The electronic color display of claim 1 comprising a plurality of pixels wherein each pixel in the plurality of pixels comprises:
    a group of four discrete LEDs from the plurality of LEDs wherein the four discrete LEDS are physically in close proximity to each other.

8. The electronic color display of claim 7 wherein a first discrete LED in the group of four discrete LEDs comprises a red LED, the red LED emitting red light;
    wherein a second discrete LED in the group of four discrete LEDs comprises a blue LED, the blue LED emitting blue light;
    wherein a third discrete LED in the group of four discrete LEDs comprises a green LED, the green LED emitting green light;
    wherein a fourth discrete LED in the group of four discrete LEDs comprises an amber LED, the amber LED emitting amber light.

9. The electronic color display of claim 8 wherein the electronic color display is a full color display board.

* * * * *